(12) United States Patent
Chindalore et al.

(10) Patent No.: US 7,064,030 B2
(45) Date of Patent: Jun. 20, 2006

(54) METHOD FOR FORMING A MULTI-BIT NON-VOLATILE MEMORY DEVICE

(75) Inventors: Gowrishankar L. Chindalore, Austin, TX (US); Jane A. Yater, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 162 days.

(21) Appl. No.: 10/961,014

(22) Filed: Oct. 8, 2004

(65) Prior Publication Data

US 2006/0079051 A1 Apr. 13, 2006

(51) Int. Cl.
*H01L 21/336* (2006.01)
(52) U.S. Cl. .................... 438/257; 438/267
(58) Field of Classification Search ........ 438/257–267, 438/142, 197, FOR 202, FOR 203; 257/314–320, 257/E29.129, E29.3, E21.179, E21.679, E21.681; 977/DIG. 1
See application file for complete search history.

(56) References Cited

U.S. PATENT DOCUMENTS

| 5,966,603 | A | 10/1999 | Eitan | |
|---|---|---|---|---|
| 6,297,096 | B1 | 10/2001 | Boaz | |
| 6,352,895 | B1 * | 3/2002 | Lam | 438/253 |
| 6,373,096 | B1 | 4/2002 | Hisamune et al. | |
| 6,687,156 | B1 | 2/2004 | Kobayashi et al. | |
| 6,706,599 | B1 | 3/2004 | Sadd et al. | |
| 6,727,144 | B1 * | 4/2004 | Hashimoto | 438/257 |
| 6,787,418 | B1 * | 9/2004 | Chu et al. | 438/259 |
| 2003/0080372 | A1 | 5/2003 | Mikolajick | |
| 2004/0095797 | A1 | 5/2004 | Yuan et al. | |

* cited by examiner

Primary Examiner—Brook Kebede
(74) Attorney, Agent, or Firm—Joanna G. Chiu; Robert L. King

(57) ABSTRACT

Forming a non-volatile memory device includes providing a semiconductor substrate, forming a masking layer having a first plurality of openings overlying the semiconductor substrate, forming diffusion regions in the semiconductor substrate at locations determined by the masking layer, forming a dielectric within the first plurality of openings, removing the masking layer to form a second plurality of openings, forming sacrificial spacers along edges of the second plurality of openings and adjacent to the dielectric, forming a separating dielectric to separate the sacrificial spacers within each of the second plurality of openings, forming a sacrificial protection layer overlying the separating dielectric, removing the sacrificial spacers, removing the sacrificial protection layer, forming at least two memory storage regions within each of the second plurality of openings, and forming a common control electrode overlying the at least two memory storage regions. This device may be used, for example, in a VGA memory array.

21 Claims, 10 Drawing Sheets

METHOD FOR FORMING A MULTI-BIT NON-VOLATILE MEMORY DEVICE

RELATED APPLICATION

This is related to co-pending U.S. patent application Ser. No. 10/961,295, entitled "A Virtual Ground Memory Array and Method Therefor," by Craig T. Swift et al., filed on Oct. 12, 2004, assigned to the current assignee thereof, and co-pending U.S. application Ser. No. 10/961,296, entitled "A Virtual Ground Memory Array and Method Therefor," by Erwin J. Prinz et al., filed on Oct. 12, 2004 and assigned to the current assignee hereof.

FIELD OF THE INVENTION

The present invention relates generally to semiconductor device processing, and more specifically, to forming a multi-bit non-volatile memory device.

RELATED ART

One type of non-volatile memory uses traps in an insulating layer for charge storage. One material used in such a manner is silicon nitride. Typically, the nitride charge storage layer is surrounded by other insulating layers such as oxide forming an oxide-nitride-oxide (ONO) structure. Charge stored within the nitride is used to manipulate a threshold voltage of the transistor, and in this manner, store data. A conventional non-volatile memory gate cell typically exists in one of two states representing either a logical zero or a logical one. To increase the capacity of a memory device without significantly increasing the size of the memory, a multi-bit memory cell may be used that is capable of storing more than two states. Non-volatile memory cells of this type, referred to herein as multi-bit memory cells, have been historically implemented by controlling the amount of charge that is injected into portions (i.e. bit cell regions) of the nitride charge storage layer.

The reliability of multi-bit memory cells that rely on localization of charge is susceptible to charge migration that delocalizes the stored charge. More specifically, the charge may migrate through the nitride layer, causing the stored logic states to change. In multi-bit non-volatile memory cells that use multiple independent floating gates, it has been necessary to use multiple non-self-aligned masking steps to fabricate the multiple floating gates, significantly increasing the cost of the device due to the increased processing complexity and larger size of the memory cell. Also, current methods of forming multi-bit non-volatile memory cells result in less reliable cells due, for example, to the thin oxide between bit storage regions within a cell or to the need to remove sacrificial layers which overly the charge storage layer during formation of the cell where such removal may damage the charge storage layer.

Therefore, there is a need for a multi-bit non-volatile memory device having good data retention capabilities.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Various embodiments described herein form separating dielectric portions which separate bit regions within a multi-bit non-volatile memory devices. These separating dielectric portions may be formed without damaging underlying materials, such as underlying charge storage materials. In one embodiment, some of these multi-bit non-volatile memory devices may be used in a virtual ground architecture (VGA) memory array having buried bit lines and common word lines. Alternatively, some of these multi-bit non-volatile memory devices may be used in shared source/drain arrays.

Figure 1:
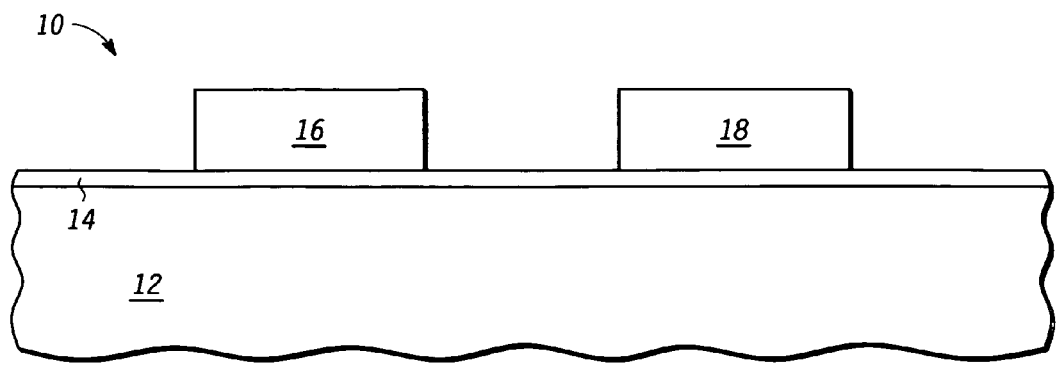
FIGS. 1–14 illustrate, in cross-sectional views, a method for forming a multi-bit non-volatile memory device in accordance with one embodiment of the present invention.

FIGS. 1–14 illustrate, in cross-sectional views, a method for forming a multi-bit non-volatile memory device in accordance with one embodiment of the present invention. FIG. 1 illustrates a portion of a non-volatile memory array 10 in accordance with one embodiment of the present invention. In the illustrated embodiment, array 10 includes a substrate 12, a sacrificial dielectric layer 14 overlying substrate 12, and a patterned masking layer having mask portions 16 and 18 overlying sacrificial dielectric layer 14. In one embodiment, substrate 12 is any type of semiconductor substrate. In one embodiment, semiconductor substrate 12 may be formed of any semiconductor material, such as, for example, silicon, germanium, silicon germanium, gallium arsenide or the like. Semiconductor substrate 12 may be a bulk substrate or a semiconductor-on-insulator (SOI) substrate including a semiconductor layer (formed of any semiconductor material) overlying an insulating layer (such as, for example, a buried oxide layer) which overlies a support layer (formed, for example, of any type of material which provides support to the insulating layer and semiconductor layer. Note that, in one embodiment, well implants and/or trench isolations (not illustrated in FIG. 1) may be formed within substrate 12 prior to formation of mask portions 16 and 18.

In one embodiment, sacrificial dielectric layer 14 is a thermally grown oxide layer having a thickness in a range of approximately 5 to 10 nanometers. Conventional deposition and patterning techniques may be used to form mask portions 16 and 18. In one embodiment, mask portions 16 and 18 include nitride. Note that in this embodiment, sacrificial dielectric layer 14 may be used as an etch stop layer for the formation of mask portions 16 and 18.

Figure 2:
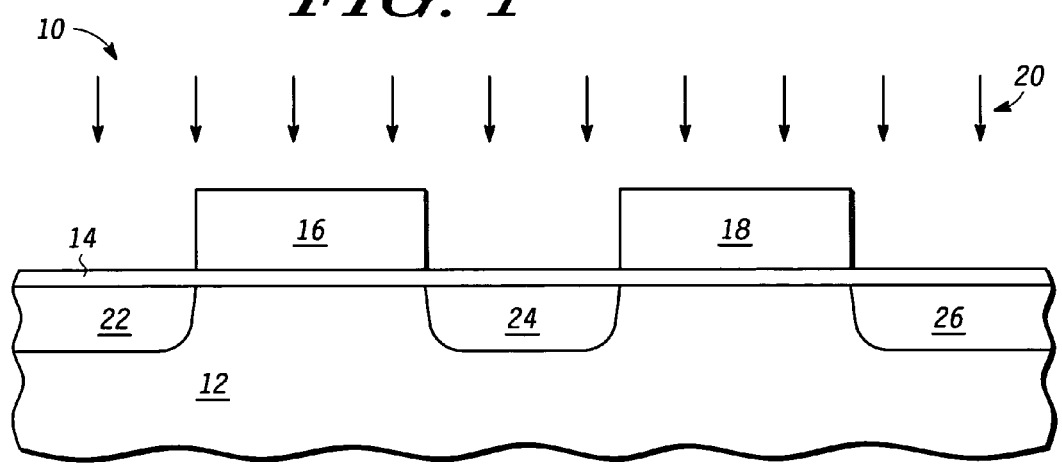

FIG. 2 illustrates array 10 after performing an implant 20 to form diffusion regions 22, 24, and 26. In one embodiment, a heavy n-type implant, such as, for example, arsenic or phosphorous, may be used to form n-type diffusion regions 22, 24, and 26. However, in alternate embodiments, a p-type implant may be used to form p-type diffusion regions. Note that diffusion regions 22, 24, and 26 are formed within portions of substrate 12 not underlying mask portions 16 and 18.

Figure 3:
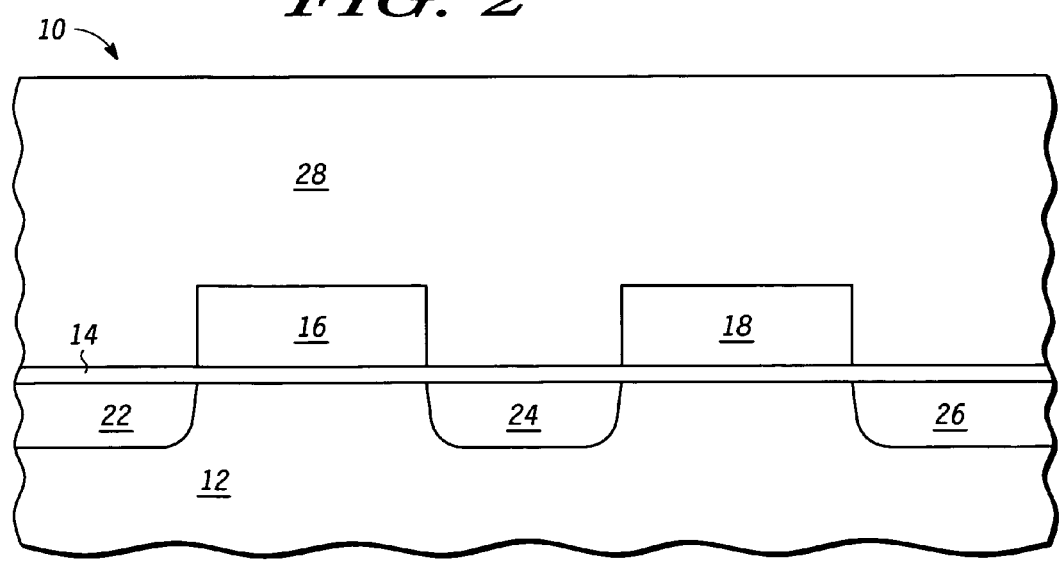

FIG. 3 illustrates array 10 after formation of a dielectric layer 28 overlying substrate 12 and mask portions 16 and 18. In one embodiment, dielectric layer 28 is deposited by chemical vapor deposition (CVD), physical vapor deposition (PVD), sputtering, or the like such that dielectric layer 28 is conformal, filling the openings between mask portions, such as mask portions 16 and 18.

Figure 4:
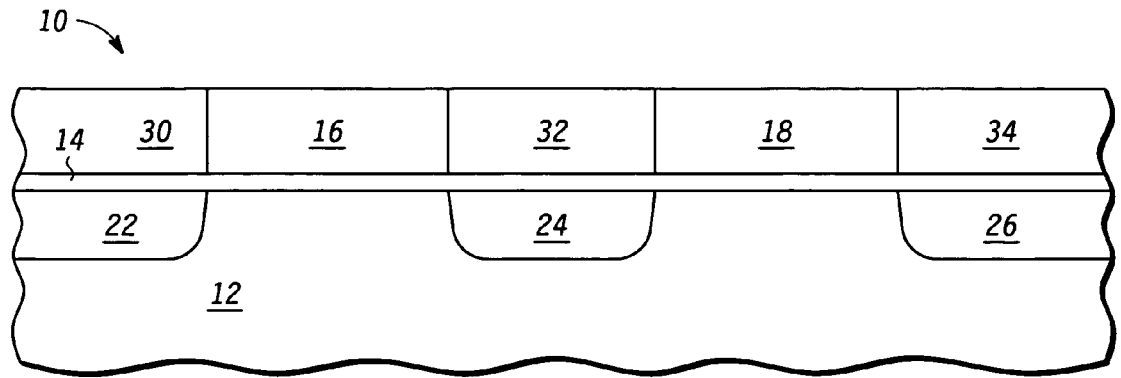

FIG. 4 illustrates array 10 after planarizing dielectric layer 28 to form insulating dielectric portions 30, 32, and 34 between mask portions such as mask portions 16 and 18. Therefore, note that dielectric portions 30, 32, and 34 are formed such that they substantially fill openings within the masking layer (having mask portions 16 and 18). In one embodiment, the planarization of dielectric layer 28 is performed by chemical mechanical polishing (CMP) with mask portions 16 and 18 providing end points for the CMP. In one embodiment, dielectric layer 28 (and thus, remaining portions 30, 32, and 34) is silicon oxide (e.g. $SiO_2$). However, alternatively, the material of dielectric layer 28 may be other dielectric materials, such as, for example, dielectrics having a low dielectric constant (a dielectric constant less than that of silicon dioxide). In one embodiment, insulating dielectric portions 30, 32, and 34 have a thickness in a range of approximately 50 to 100 nanometers.

Figure 5:
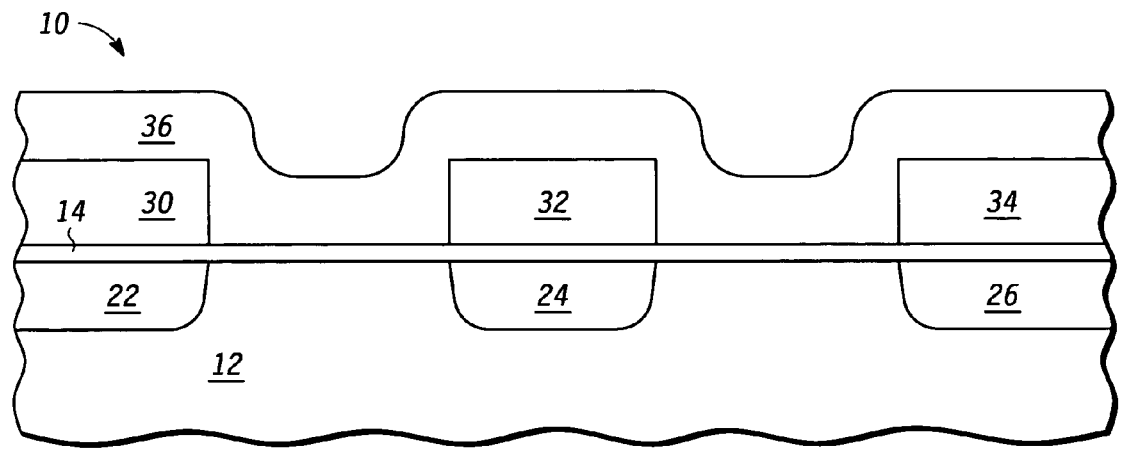

FIG. 5 illustrates array 10 after removal of mask portions 16 and 18 and after subsequent formation of a sacrificial spacer layer 36. In one embodiment, an isotropic wet etch is used to remove mask portions 16 and 18 where sacrificial dielectric layer 14 operates as an etch stop for the removal of these portions. In one embodiment, sacrificial spacer layer 36 is a conformal nitride layer. Alternatively, sacrificial spacer layer 36 may be a conformal oxide layer.

Figure 6:
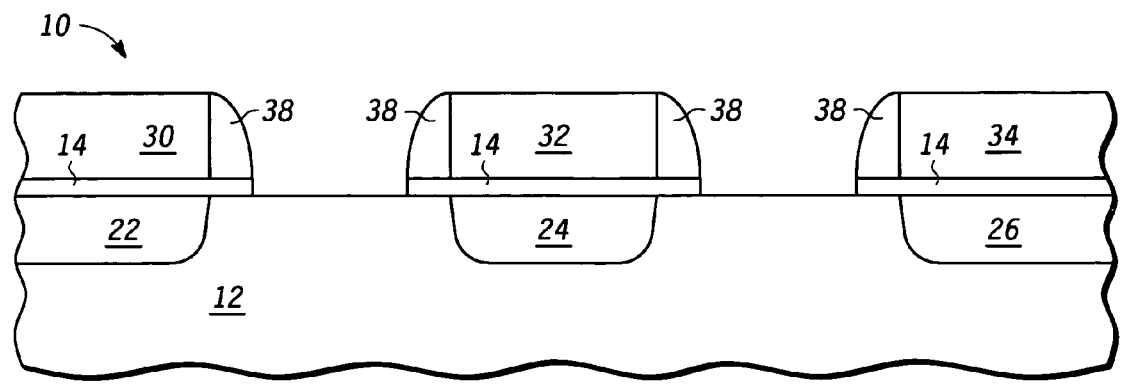

FIG. 6 illustrates array 10 after formation of sacrificial spacers 38 from sacrificial spacer layer 36. For example, an anisotropic etch of sacrificial spacer layer 36 may be performed to form sacrificial spacers 38 adjacent sidewalls of insulating dielectric portions 30, 32, and 34. (That is, note that sacrificial spacers 38 are formed along edges within openings defined by insulating dielectric portions 30, 32, and 34.) Note that during the anisotropic etch which results in spacers 38, portions of sacrificial dielectric layer 14 between spacers 38 may be removed. Alternatively, after formation of spacers 38, portions of sacrificial dielectric layer 14 between spacers 38 may be removed using a wet etch.

Figure 7:
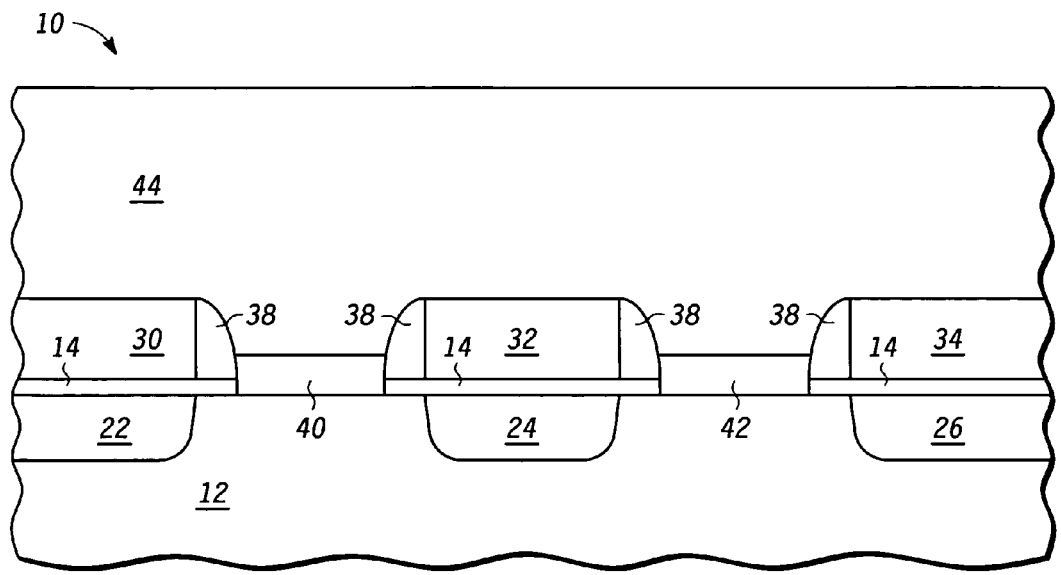

FIG. 7 illustrates array 10 after formation of separating dielectric portion 40 (between insulating dielectric portions 30 and 32) and separating dielectric portion 42 (between insulating dielectric portions 32 and 34). In one embodiment, separating dielectric portions 40 and 42 are thermally grown oxides. Alternatively, separating dielectric portions 40 and 42 may be other dielectrics having charge trapping and leakage properties similar to thermally grown oxide. For example, they may be formed of other low dielectric constant materials (those materials have a dielectric constant less than silicon dioxide). In one embodiment, separating dielectric portions 40 and 42 have a thickness in a range of approximately 10 to 20 nanometers. In one embodiment, separating dielectric portions 40 and 42 have a thickness that is at least approximately 15 to 20 nanometers thicker than sacrificial dielectric layer 14. After formation of separating dielectric portions 40 and 42, a sacrificial protect layer 44 is formed over insulating dielectric portions 30, 32, 34, spacers 38, and separating dielectric portions 40 and 42. In one embodiment, sacrificial protect layer 44 is a deposited silicon layer. Alternatively, other materials, such as, for example nitride, may be used in place of or in addition to silicon for sacrificial protect layer 44.

Figure 8:
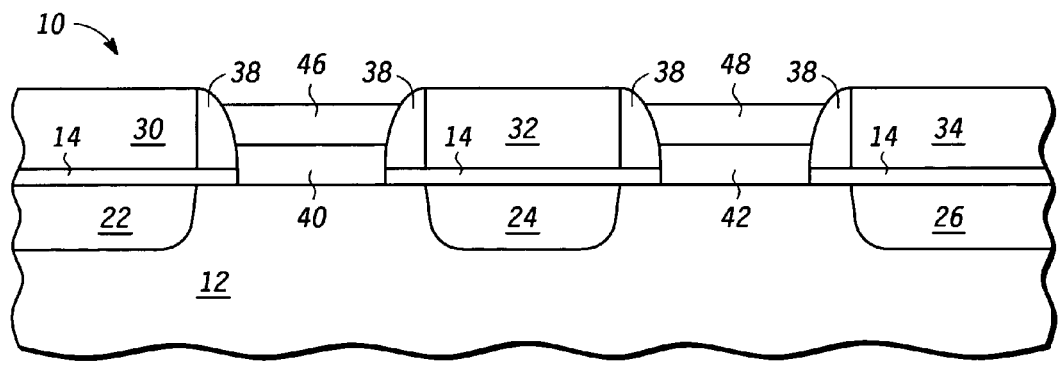

FIG. 8 illustrates array 10 after planarization of sacrificial protect layer to form thinned sacrificial protect layer portion 46 (overlying separating dielectric layer 40) and thinned sacrificial protect layer portion 48 (overlying separating dielectric layer 42). In one embodiment, planarization is performed by CMP. Note that, in the illustrated embodiment, the planarization of sacrificial protect layer 44 exposes portions of spacers 38 so that they may be subsequently removed. In an alternate embodiment, the formation of thinned sacrificial protect layer portions 46 and 48 may be formed by etching rather than polishing.

Figure 9:
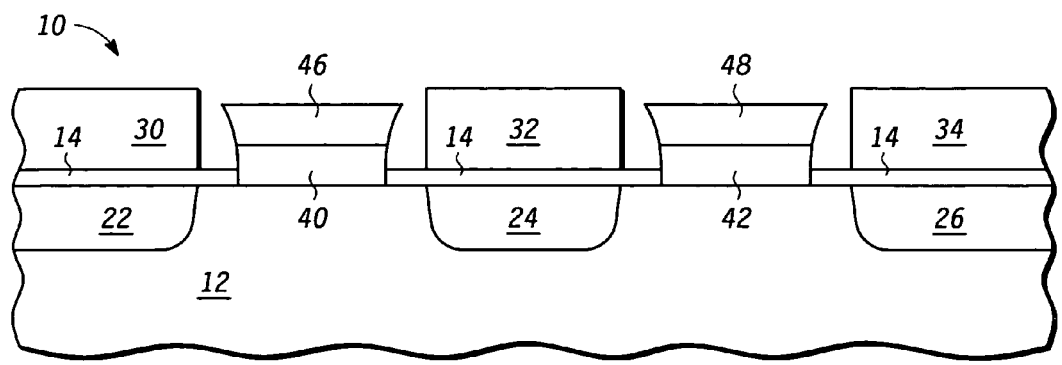

FIG. 9 illustrates array 10 after removal of spacers 38 using, for example, a wet etch. Therefore, note that in alternate embodiments, the material of thinned sacrificial protect layer portions 46 and 48 may be any material which is not substantially affected during the removal of spacers 38. Furthermore, in one embodiment, the material of thinned sacrificial protect layer portions 46 and 48 should be selective to separating insulating portions 40 and 42 so that portions 40 and 42 are not substantially affected during subsequent removal of thinned sacrificial protect layer portions 46 and 48. Note that thinned sacrificial protect layer portions 46 and 48 protect underlying separating insulating portions 40 and 42 during the removal of spacers 38.

Figure 10:
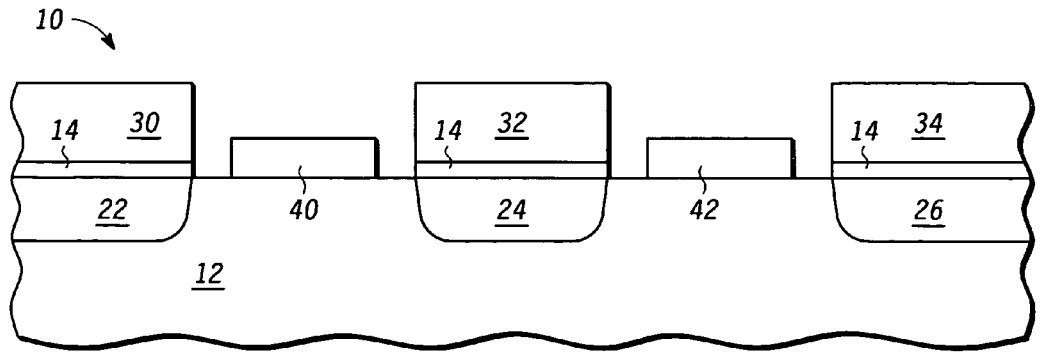

FIG. 10 illustrates array 10 after removal of thinned sacrificial protect layer portions 46 and 48 using, for example, a selective dry etch. Afterwards, a clean is performed to remove exposed portions of sacrificial dielectric layer 14 (such as between insulating dielectric portion 30 and separating dielectric portion 40, between dielectric portions 40 and 32, between dielectric portions 32 and 42, and between dielectric portions 42 and 34). Note that during the removal of exposed portions of sacrificial dielectric layer 14, portions of dielectric portions 30, 32, 34, 40, and 42 may also be etched. However, through the use of a controlled etch of exposed portions of sacrificial dielectric layer 14, overetch may be minimized.

Figure 11:
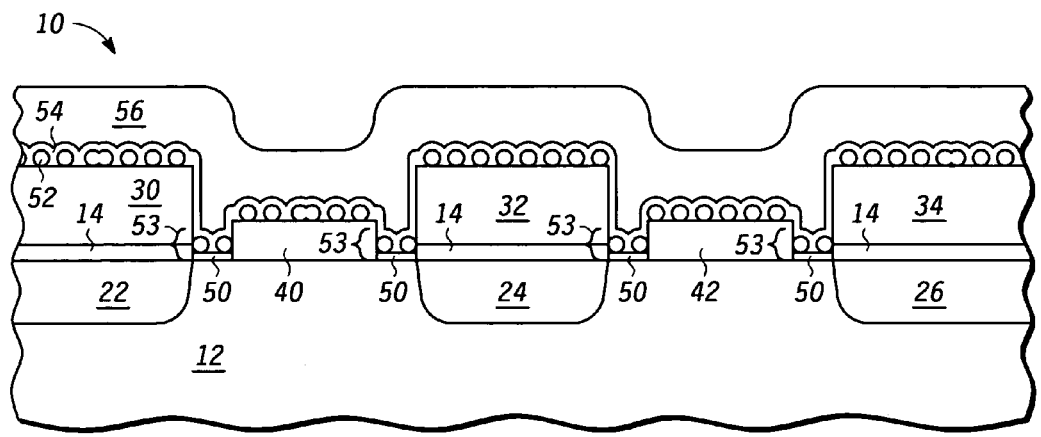

FIG. 11 illustrates array 10 after formation of a tunnel dielectric 50, nanoclusters 52, and a top dielectric layer 54. In one embodiment, tunnel dielectric 50 is a thermally grown oxide which is formed over exposed portions of substrate 12 (between dielectric portions 30 and 40, between dielectric portions 40 and 32, between dielectric portions 32 and 42, and between dielectric portions 42 and 34). Note that in this embodiment, during the formation of tunnel dielectric 50 as a thermally grown oxide, oxides may also form at the interfaces of each of dielectric portions 40 and 42 and substrate 12 and at the interfaces of sacrificial dielectric layer 14 and substrate 12. In one embodiment, tunnel dielectric 50 has a thickness in a range of approximately 2 to 10 nanometers. After formation of tunnel dielectric 50, a charge storage layer, such as nanoclusters 52, is formed over dielectric portions 30, 40, 32, 42, and 34 and over tunnel dielectric 50. In the illustrated embodiment, the charge storage layer includes a substantially continuous layer of discrete storage elements. That is, in the illustrated embodiment, nanoclusters 52 operate as discrete charge storage elements represented by the small circles in FIG. 11. Note that some of the nanoclusters may have different shapes, such as a dog bone shape, as illustrated in FIG. 11. In one embodiment, the nanoclusters are formed of silicon, but alternatively, may also be formed of germanium, silicon carbide, any number of metals, or any combination of these. Note that nanoclusters 52 may be formed using any known methods. Alternatively, other charge storage layers may be used in place of nanoclusters 52, such as a charge storage layer formed of nitride or other dielectrics having similar charge trapping properties.

After formation of nanoclusters 52, a top dielectric layer 54 is formed over nanoclusters 52. In one embodiment, top dielectric layer 54 is a deposited conformal dielectric, such as, for example, a deposited oxide. Note that stacks 53 are therefore formed between dielectric portions 30 and 40, between dielectric portions 40 and 32, between dielectric portions 32 and 42, and between dielectric portions 42 and 34. These stacks include a charge storage layer (e.g. nanoclusters 52) sandwiched between two insulating layers (e.g. tunnel dielectric 50 and top dielectric layer 54). Note that in alternate embodiments, different stacks having different charge storage layers and insulating layers from those illustrated may be used (where tunnel dielectric layer 50, nanoclusters 52, and top dielectric layer 54 may be formed differently, or may be replaced by any number of different layers, as needed). For example, stacks 53 may include at least one of a plurality of nanoclusters, nitride traps, oxide traps, metal or polysilicon floating gates, or a combination thereof.

After formation of top dielectric layer 54, a spacer gate layer 56 is formed over top dielectric layer 54. In one embodiment, spacer gate layer 56 is formed by depositing silicon. Note that spacer gate layer 56 may be other materials, but is generally the same as the material which will be used to form the word line conductor.

Figure 12:
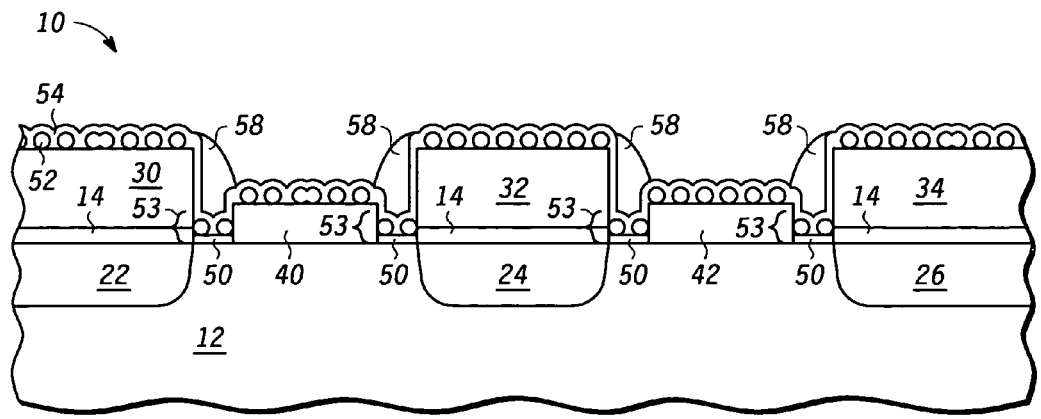
Figure 13:
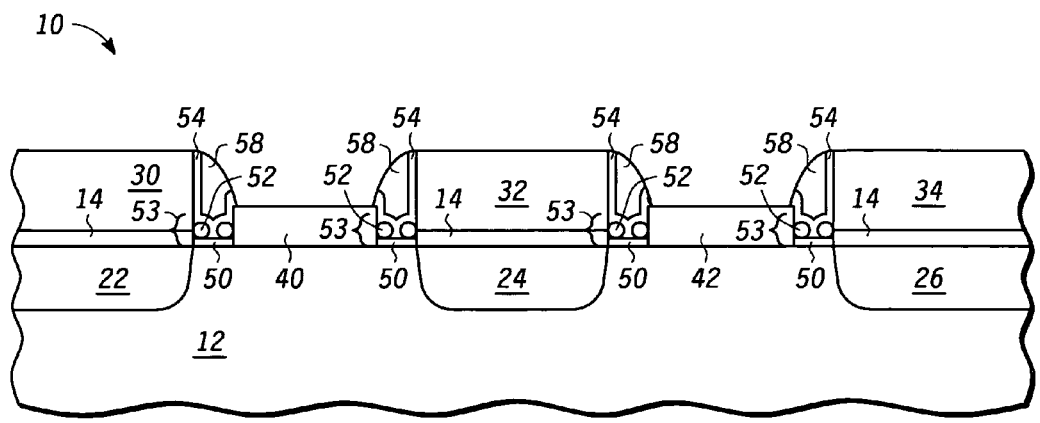

FIG. 12 illustrates array 10 after formation of spacer gates 58. In one embodiment, spacer gate layer 56 is anisotropically etched to form spacer gates 58. FIG. 13 illustrates array 10 after exposed portions of top dielectric layer 54 and nanoclusters 52 are removed, where stacks 53 underlying spacer gates 58 remain. Note that spacer gates 58 protect stacks 53 (e.g. protects tunnel dielectric layer 50 and portions of nanoclusters 52 and top dielectric layer 54 which overly tunnel dielectric layer 50).

Figure 14:
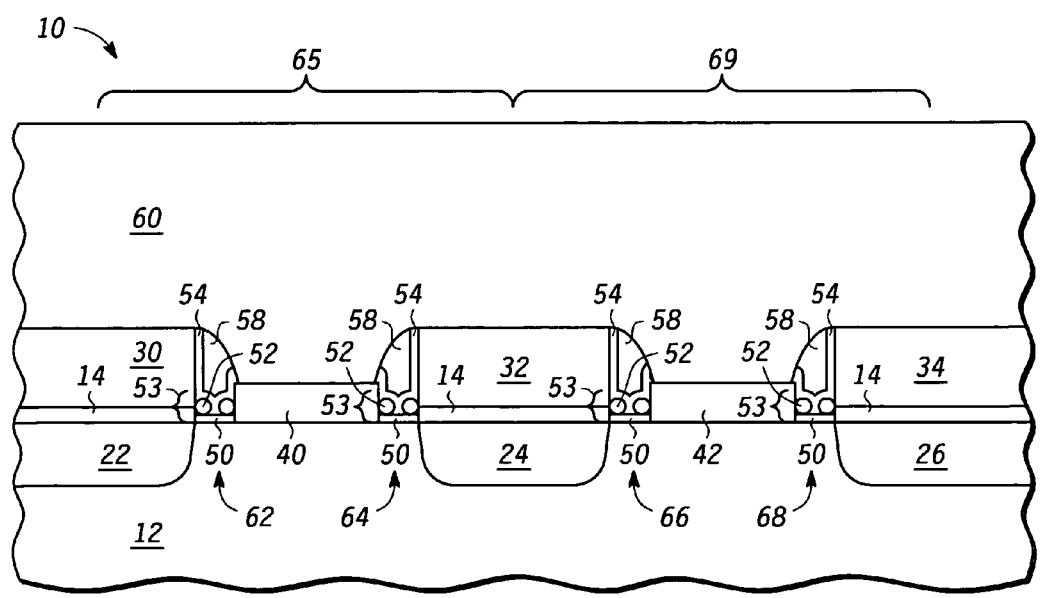

FIG. 14 illustrates array 10 after formation of word line conductor 60 over substrate 12 (over dielectric portions 30, 40, 32, 42, and 34 and over spacers 58). In one embodiment, word line conductor 60 is formed by depositing silicon. Note that spacers 58 and word line conductor 60 are electrically connected. That is, in one embodiment, spacers 58 and word line conductor 60 are formed of a same material (e.g. silicon) thus forming an electrically continuous word line. Alternatively, spacers 58 may be formed of a different material from word line conductor 60 where spacers 58 and word line conductor 60 are still electrically connected. Therefore, note that FIG. 14 illustrates two memory devices 65 and 69 formed as part of array 10. Each device includes multiple bit storage regions 62 and 64 (within device 65) and 66 and 68 (within device 69) where each bit storage region within a device may store charge independently of the other bit storage region within the device. For example, bit storage region 62 may store charge representative of a logic level one or zero and bit storage region 64 may store charge representative of a logic level one or zero, independently of bit region 62. Also, each of bit regions 62 and 64 share a common control electrode (word line conductor 60, in the illustrated embodiment), and each of bit regions 66 and 68 share a common control electrode (word line conductor 60, in the illustrated embodiment.) Note also that devices 65 and 69 share a common word line (word line conductor 60) and share diffusion region 24.

In the illustrated embodiment, array 10 is part of a virtual ground architecture (VGA) where diffusion regions 22, 24, and 26 may be referred to as buried bit lines. Note that insulating dielectric portions 30, 32, and 34 electrically insulate word line conductor 60 from buried bit lines 22, 24, and 26, respectively. The thickness of insulating dielectric portions 30, 32, and 34 may also help reduce the capacitance between word line conductor 60 and underlying buried bit lines. Also, note that separating dielectric portions 40 and 42 provide separation between bit charge regions of devices 65 and 69, respectively. Note that, in one embodiment, separating dielectric portions 40 and 42 are sufficiently thick to avoid degradation due to voltage stress during program and erase cycles. For example, during programming of bit storage region 64, the gate voltage (i.e. voltage of word line conductor 60) may be set to greater than 6 volts while buried bit line 24 may be set to greater than 3 volts and buried bit line 22 may be set to ground. In this manner, bit storage region 64 is charged by hot carrier injection. Also, during erase cycles using Fowler-Nordheim tunneling, the gate to substrate voltage could exceed 12 volts. Therefore, in one embodiment, the separating dielectric portions 40 and 42 are formed to withstand these voltage stresses.

Figure 15:
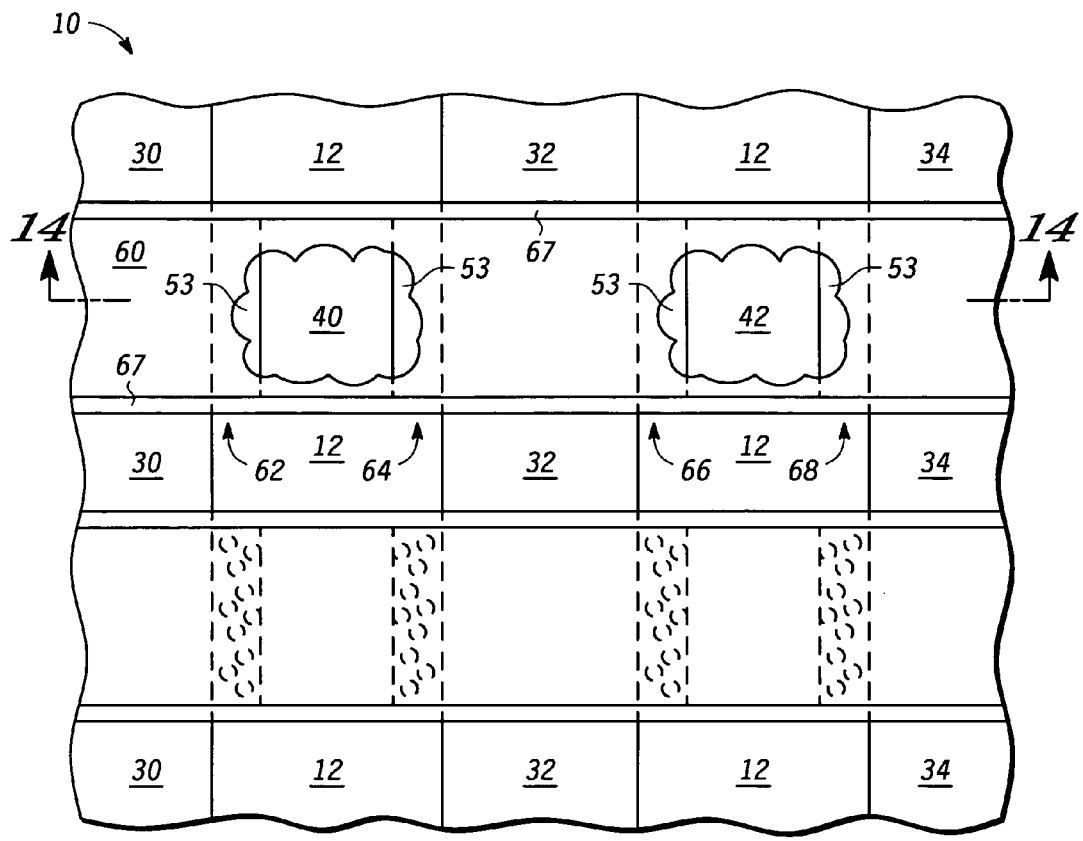
FIG. 15 illustrates, in a top-down view, a portion of a multi-bit non-volatile memory array, in accordance with one embodiment of the present invention.

FIG. 15 illustrates a top down view of a portion of array 10, where a cross-section taken along the line labeled "14" corresponds to the cross-sectional view of FIG. 14. Therefore, note that word line conductor 60 overlies dielectric portions 30, 32, and 34 and substrate 12. Also, word line conductor 60 overlies stacks 53 and dielectric portions 40 and 42 (as illustrated by the cloud-shaped cut-outs in FIG. 15). Note also that spacers 67 may be formed on either side of word line conductor 60, where these spacers may be, for example, nitride spacers (these spacers are not illustrated in FIG. 14 since they would reside behind and in front of the page). Spacers 67 are formed to isolate word line conductors from each other so that, for example, during silicidation, the word line conductors are not shorted to each other via the silicide formed on the word line conductors and substrate between the word line conductors. FIG. 15 illustrates a top-down view of devices 65 and 69 of FIG. 14 and of two other devices below devices 65 and 69 where each includes two bit storage regions, as illustrated by the dotted nanoclusters. Note that the bottom word line conductor is isolated from word line conductor 60 via spacers such as spacer 67. Also, note that array 10 may include any number of multi-bit devices.

Figure 16:
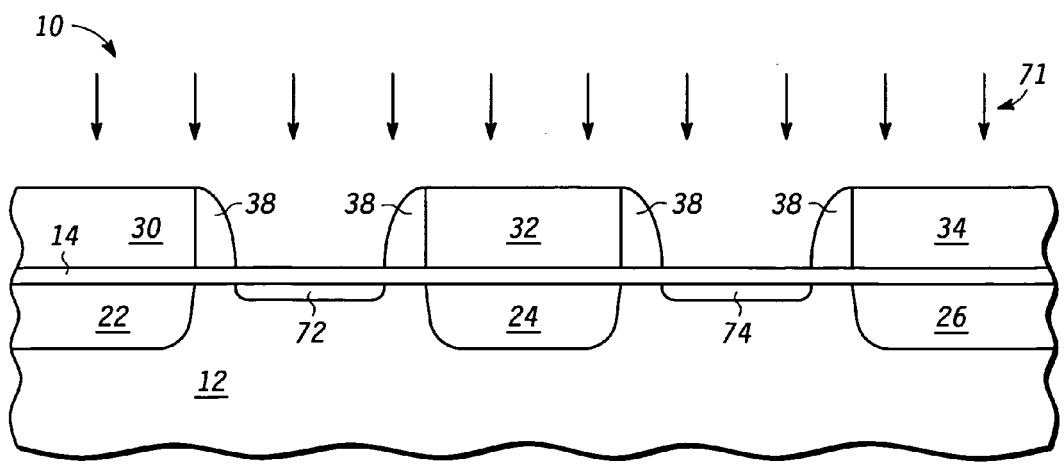
FIGS. 16–18 illustrate, in cross-sectional views, a method for forming a multi-bit non-volatile memory device in accordance with an alternate embodiment of the present invention.
Figure 17:
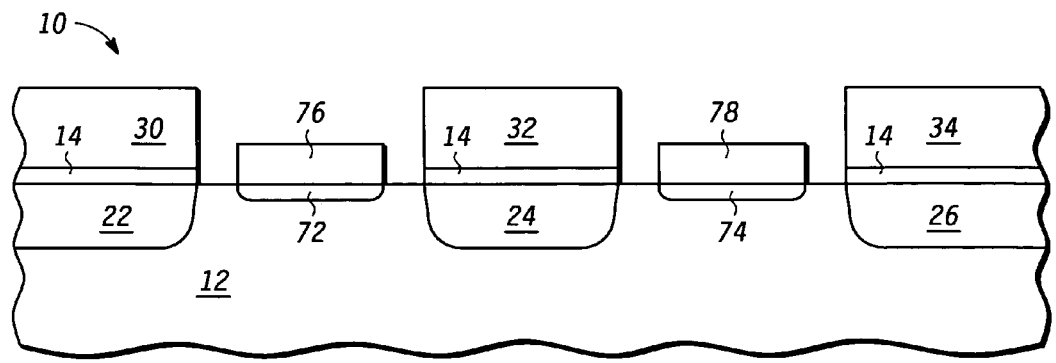
Figure 18:
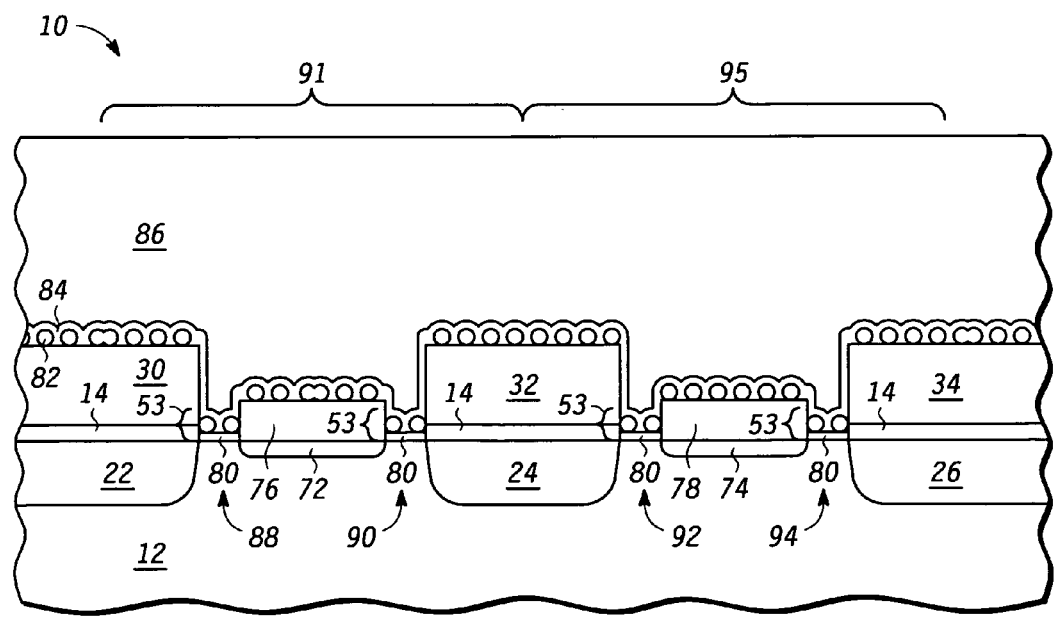

FIGS. 16–18 illustrate cross-sectional view of array 10 illustrating a method for forming a multi-bit non-volatile memory device in accordance with an alternate embodiment of the present invention. FIG. 16 illustrates processing steps following FIG. 6 described above. In one embodiment, prior to removal of exposed portions of sacrificial dielectric layer 14, an implant 71 is performed to form threshold adjust implant regions 72 and 74 within exposed portions of substrate 12 between spacers 38. As will be described below, the threshold voltages in these regions will be lowered. In one embodiment, implant 71 is an n-type implant (such as arsenic or phosphorous) into a p-type well. However, note that in alternate embodiments, a p-type implant may be performed into an n-type well. FIG. 17 illustrates array 10 after formation of separating dielectric portions 76 and 78, where these portions are formed using the same processing described above in reference to the formation of separating dielectric portions 40 and 42, respectively.

FIG. 18 illustrates array 10 after formation of tunnel dielectric 80, nanoclusters 82, and top dielectric layer 84. Note that these layers may be formed using the same processing described above in reference to tunnel dielectric 50, nanoclusters 52, and top dielectric layer 54. Therefore, the descriptions and alternatives provided above for these insulating layers and charge storage layer also apply to the embodiment of FIG. 18. After formation of top dielectric layer 84, however, a word line conductor 86 is formed over top dielectric layer 84. In one embodiment, word line conductor 86 is formed by depositing silicon. Therefore, note that FIG. 18 illustrates two memory devices 91 and 95 formed as part of array 10. Each device includes multiple bit storage regions 88 and 90 (within device 91) and 92 and 94 (within device 95) where each bit storage region within a device may store charge independently of the other bit storage region within the device. Therefore, the descriptions of operation and of insulating dielectric portions 30, 32, and 34 provided above apply here as well. Also, the descriptions of separating dielectric portions 40 and 42 provided above apply here to separating dielectric portions 76 and 78 as well.

Note that in this alternate embodiment, as opposed to the embodiment of FIG. 14, gate spacers are not formed in the bit storage regions. In the illustrated embodiment, the charge storage layer (e.g. nanoclusters 82) remain over dielectric portions 30, 76, 32, 78, and 34; therefore, the gate spacers are not needed to protect the charge storage layer during removal of portions of the charge storage layer. However, the presence of the charge storage layer over separating dielectric portions 76 and 78 increases the effective dielectric thickness over the channel regions, making it more difficult to invert the channel region at lower voltages. Therefore, note that the threshold adjust implant regions 72 and 74 operate to lower the threshold voltages of these channel regions such that inversion at the lower voltages is possible. Also, in one embodiment, the thickness of separating dielectric portions 76 and 78 is sufficient to ensure that hot carrier injection occurs only in the bit cell regions 88, 90, 92, and 94 and not in the areas between these regions within the respective devices.

Figure 19:
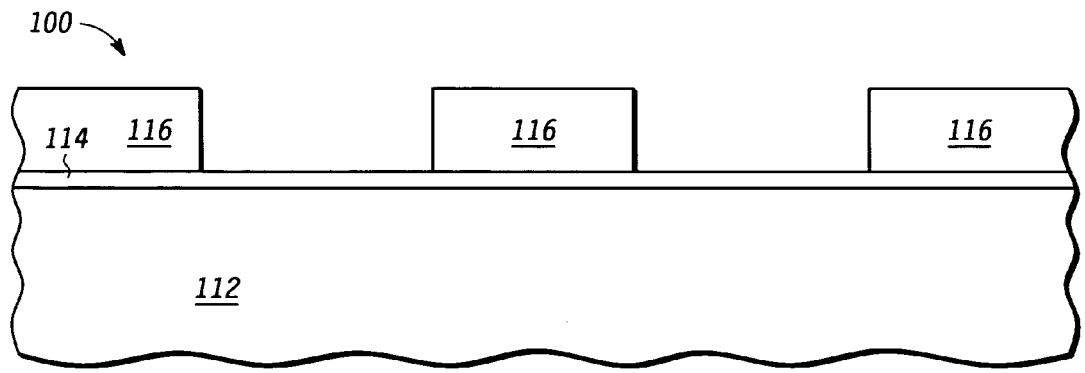
FIGS. 19–27 illustrate, in cross-sectional views, a method for forming a multi-bit non-volatile memory device in accordance with another alternate embodiment of the present invention.

FIGS. 19–27 illustrate, in cross-sectional views, a method for forming a multi-bit non-volatile memory device in accordance with one embodiment of the present invention. FIG. 19 illustrates a portion of a non-volatile memory array 100 in accordance with one embodiment of the present invention. In one embodiment, upon completion, array 100 will have a shared source/drain array structure. In the illustrated embodiment, array 100 includes a substrate 112, a sacrificial dielectric layer 114 overlying substrate 112, and a patterned masking layer having mask portions 116 overlying sacrificial dielectric layer 114. The descriptions and alternatives provided above for substrate 12 and sacrificial dielectric layer 14 also apply to substrate 112 and sacrificial dielectric layer 114. Note that, in one embodiment, well implants and/or trench isolations (not illustrated in FIG. 19) may be formed within substrate 112 prior to formation of mask portions 116. Conventional deposition and patterning techniques may be used to form mask portions 116. In one embodiment, mask portions 116 include an oxide.

Figure 20:
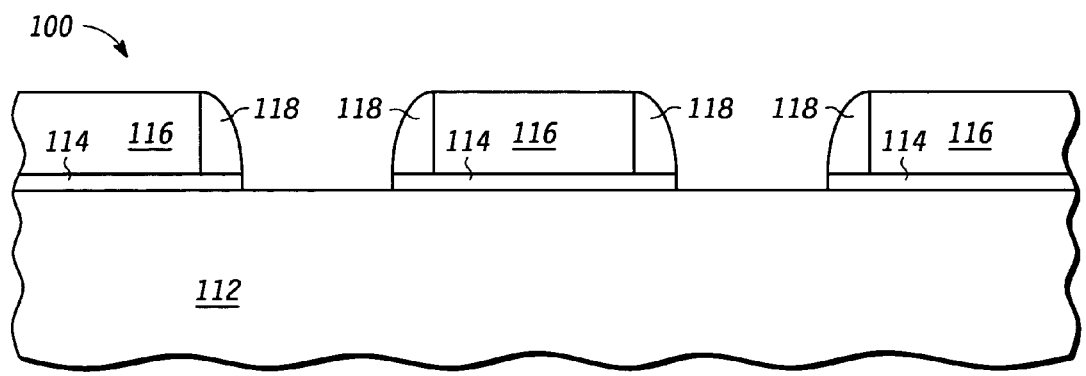

FIG. 20 illustrates array 100 after formation of sacrificial spacers 118. In one embodiment, sacrificial spacers 118 adjacent to the sidewalls of masking portions 116 are formed by depositing a sacrificial spacer layer and anisotropically etching the sacrificial spacer layer. In one embodiment, sacrificial spacers 118 are formed of nitride. Note that during the anisotropic etch which results in spacers 118, portions of sacrificial dielectric layer 114 between spacers 118 may be removed. Alternatively, after formation of spacers 118, portions of sacrificial dielectric layer 114 between spacers 118 may be removed using a wet etch.

Figure 21:
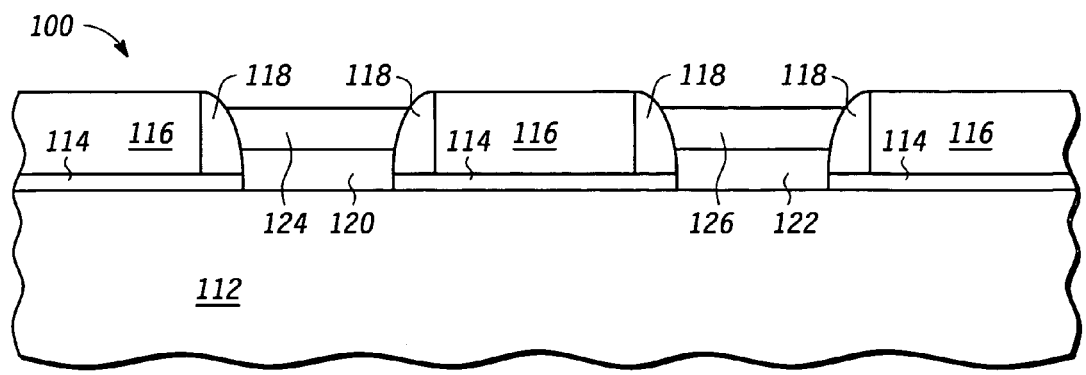

FIG. 21 illustrates array 100 after formation of separating dielectric portions 120 and 122, each between adjacent mask portions and after formation of thinned sacrificial protect layer portion 124 (overlying separating dielectric portion 120) and thinned sacrificial protect layer portion 126 (overlying separating dielectric portion 126). Note that the descriptions (including, for example, the materials, processes, dimensions, etc.) and alternatives provided above for separating dielectric portions 40 and 42 and thinned sacrificial protect layer portions 46 and 48 apply to separating dielectric portions 120 and 122 and thinned sacrificial protect layer portions 124 and 126, respectively. That is, for example, separating dielectric portions 120 and 122 and thinned sacrificial protect layer portions 124 and 126 may be formed in the same manner as described above in reference to FIGS. 7 and 8.

Figure 22:
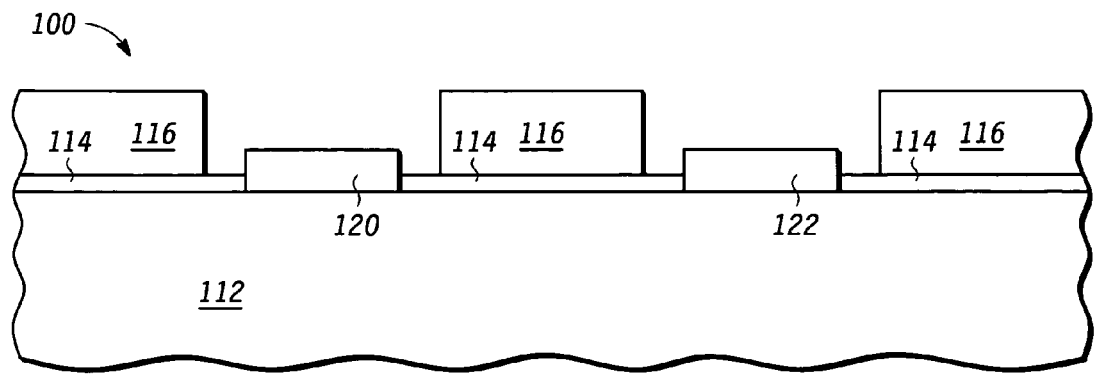

FIG. 22 illustrates array 100 after removal of spacers 118 using, for example, a wet etch. As was described above in reference to FIG. 9, note that sacrificial protect layer portions 124 and 126 protect underlying separating insulating portions 120 and 122 during the removal of spacers 118. After removal of spacers 118, thinned sacrificial protect layer portions 124 and 126 are removed using, for example, a selective dry etch. Afterwards, a clean is performed to remove exposed portions of sacrificial dielectric layer 114 (such as between insulating mask portions 116 and separating dielectric portions 120 and 122). Note that during the removal of exposed portions of sacrificial dielectric layer 114, portions of dielectric portions 116, 120, and 122 may also be etched. However, through the use of a controlled etch of exposed portions of sacrificial dielectric layer 114, overetch may be minimized.

Figure 23:
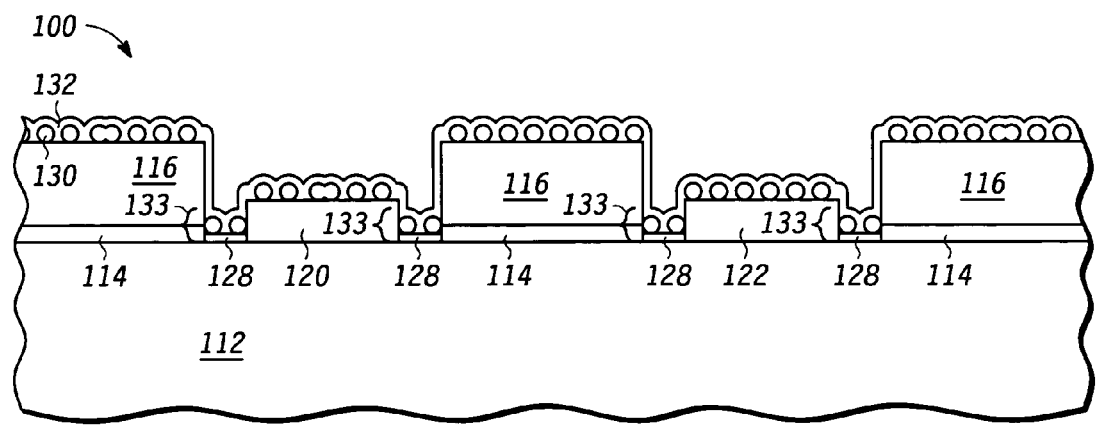

FIG. 23 illustrates array 100 after formation of a tunnel dielectric 128, nanoclusters 130, and a top dielectric layer 132. Note that the descriptions (including, for example, the materials, processes, dimensions, etc.) and alternatives provided above for tunnel dielectric 50, nanoclusters 52, and top dielectric layer 54 also apply to tunnel dielectric 128, nanoclusters 130, and top dielectric layer 132, respectively. Note that stacks 133 are therefore formed between dielectric portion 120 and mask portions 116 and between dielectric portion 122 and mask portions 116. These stacks include a charge storage layer (e.g. nanoclusters 130) sandwiched between two insulating layers (e.g. tunnel dielectric 128 and top dielectric layer 132). Note that in alternate embodiments, different stacks having different charge storage layers and insulating layers from those illustrated may be used (where tunnel dielectric layer 128, nanoclusters 130, and top dielectric layer 134 may be formed differently, or may be replaced by any number of different layers, as needed). For example, stacks 133 may include at least one of a plurality of nanoclusters, nitride traps, oxide traps, metal or polysilicon floating gates, or a combination thereof.

Figure 24:
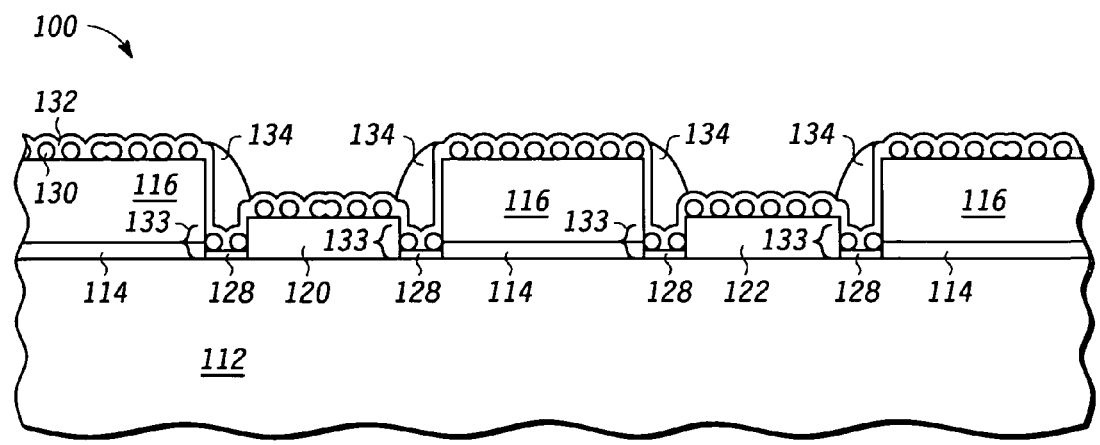

FIG. 24 illustrates array 100 after formation of spacer gates 134. In one embodiment, spacer gates 134 are formed by forming a spacer gate layer over top dielectric layer 132 and anisotropically etching this layer. In one embodiment, spacer gate 134 is formed of silicon and is generally the same as the material which will be used to form the gate electrode (also referred to as the control electrode).

Figure 25:
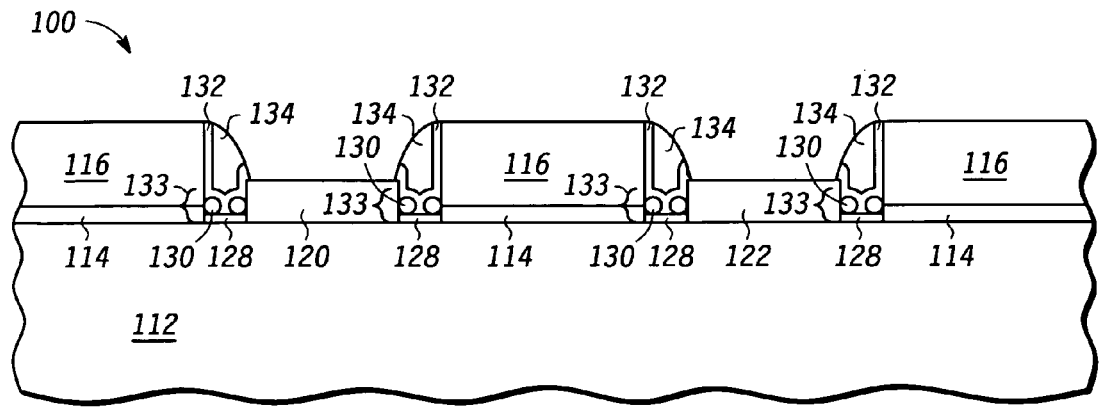

FIG. 25 illustrates array 100 after exposed portions of top dielectric layer 132 and nanoclusters 130 are removed, where stacks 133 underlying spacer gates 134 remain. Note that spacer gates 134 protect stacks 133 (e.g. protects tunnel dielectric layer 128 and portions of nanoclusters 130 and top dielectric layer 132 which overly tunnel dielectric layer 128).

Figure 26:
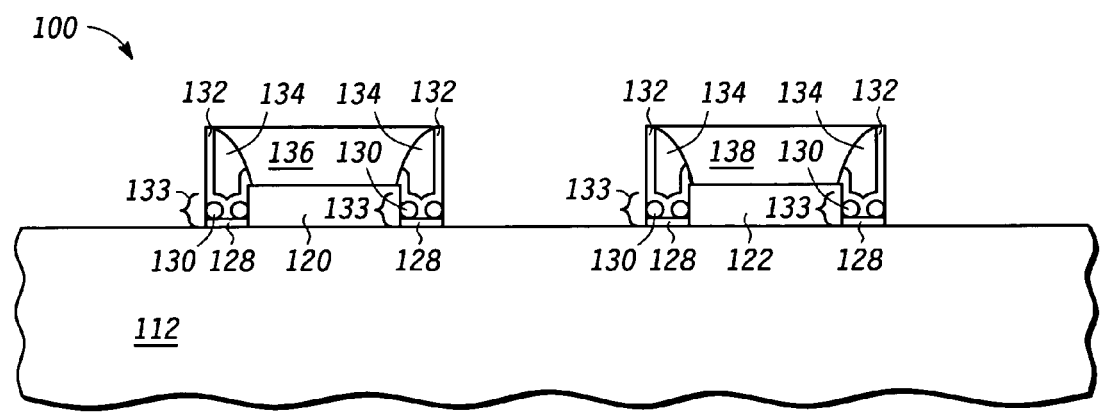

FIG. 26 illustrates array 100 after formation of gate electrode 136 over dielectric portion 120 and gate electrode 138 over dielectric portion 122. In one embodiment, gate electrodes 136 and 138 are formed by forming a gate electrode layer overlying mask portions 116, spacer gates 134, and dielectric portions 120 and 122. The gate electrode layer is then planarized, using, for example, CMP, to expose top portions of mask portions 116. Conventional etching techniques may then be used to remove mask portions 116, thus resulting in the intermediate structure illustrated in FIG. 26. In the illustrated embodiment, spacer gates 134 and corresponding gate electrodes 136 and 138 are electrically connected. That is, in one embodiment, spacers 134 and gate electrodes 136 and 138 are formed of a same material (e.g. silicon) thus forming electrically continuous gate electrodes. Alternatively, spacers 134 may be formed of a different material from gate electrodes 136 and 138 where spacers 134 and corresponding gate electrodes 136 and 138 are still electrically connected. Note that, in one embodiment of array 100, gate electrode 136 may be a part of a word line conductor within array 100 and gate electrode 138 may be a part of another word line conductor within array 100.

Figure 27:
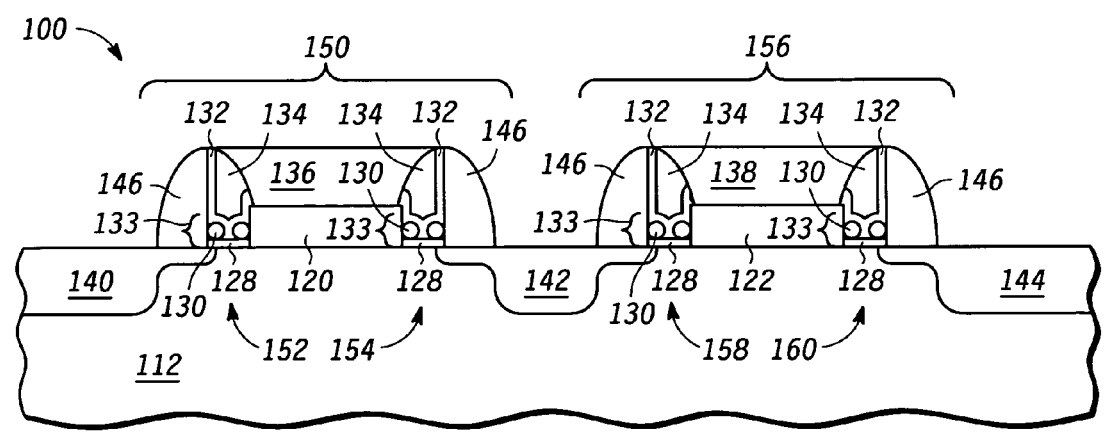

FIG. 27 illustrates array 100 after formation of spacers 146 and diffusion regions 140, 142, and 144. In one embodiment, extension regions of diffusion regions 140, 142, and 144 (i.e. those regions which extend under spacers 146) are formed by implantation prior to the formation of spacers 146. In this embodiment, spacers 146 are subsequently formed (by, for example, forming a blanket spacer layer and anisotropically etching that layer). After formation of spacers 146, the deeper portion of diffusion regions 140, 142, and 144 may be formed by implantation. Therefore, note that conventional implanting techniques and dopants may be used to form diffusion regions 140, 142, and 144. Note also that diffusion regions 140, 142, and 144 may be formed in a variety of different ways and have a variety of different forms.

Therefore, note that FIG. 27 illustrates two memory devices 150 and 156 formed as part of array 100. Each device includes multiple bit storage regions 152 and 154 (within device 150, corresponding to a common control electrode 136) and 158 and 160 (within device 156, corresponding to a common control electrode 138) where each bit storage region within a device may store charge independently of the other bit storage region within the device. For example, bit storage region 152 may store charge representative of a logic level one or zero and bit storage region 154 may store charge representative of a logic level one or zero, independently of bit region 152. Note also that devices 150 and 156 share a common diffusion region 142 (where diffusion regions 142 may be a source or drain region for devices 150 and 156). Note also that diffusion regions 140, 142, and 144 may also be referred to as source/drain regions.

Note that separating dielectric portions 120 and 122 provide separation between bit charge regions of devices 150 and 156, respectively. In one embodiment, separating dielectric portions 120 and 122 are also sufficiently thick to avoid degradation due to voltage stress during program and erase cycles.

In an alternate embodiment of FIGS. 19–27, spacer gates 134 may not be formed. In this alternate embodiment, threshold adjust implant regions similar to threshold adjust implant regions 72 and 74 may be formed under devices 150 and 156. For example, implants may be performed through sacrificial dielectric layer 114 between sacrificial spacers 118 prior to removal of sacrificial dielectric layer 114 to form threshold adjust implant regions (as was described above in reference to threshold adjust implant regions 72 and 74). Processing then continues as was described above until FIG. 23. After the processing of FIG. 23 to form nanoclusters 130 and top dielectric layer 132, a gate electrode layer may be formed over top dielectric layer 132 (without first forming spacer gates 134 of FIG. 24). Afterwards, the gate electrode layer may be planarized (using, for example, CMP) to expose top portions of mask portions 116. During this planarization, the portions of nanoclusters 130 and top dielectric layer 132 overlying mask portions 116 are removed to expose mask portions 116. (However, note that portions of nanoclusters 130 and top dielectric layer 132 remain overlying dielectric portions 120 and 122.) After the planarization, mask portions 116 may be removed using, for example, conventional etch techniques. In this manner, structures similar to those of FIG. 26 would be formed, where spacer gates 134 would not be present, and gate electrodes 136 and 138 would extend over dielectric portions 120 and 122, respectively, and over stacks 133 adjacent the corresponding dielectric portions. Note also that portions of nanoclusters 130 and top dielectric layer 132 would remain over dielectric portions 120 and 122 (between dielectric portion 120 and gate electrode 136 and between dielectric portion 122 and gate electrode 138). Processing may then continue as shown in FIG. 27 where devices 150 and 156 would operate in a similar manner. However, in this alternate embodiment, since portions of nanoclusters 130 remain overlying dielectric portions 120 and 122, the effective dielectric thickness over the channel regions of devices 150 and 156 is increased, making it more difficult to invert the channel region at lower voltages. Therefore, note that the threshold adjust implant regions may operate to lower the threshold voltages of these channel regions such that inversion at the lower voltages is possible.

Although the invention has been described with respect to specific conductivity types or polarity of potentials, skilled artisans appreciated that conductivity types and polarities of potentials may be reversed.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a non-volatile memory device, comprising:
   providing a semiconductor substrate;
   forming a masking layer having a first plurality of openings overlying the semiconductor substrate;
   forming diffusion regions in the semiconductor substrate at locations determined by the masking layer;
   forming a dielectric within the first plurality of openings;
   removing the masking layer to form a second plurality of openings;
   forming sacrificial spacers along edges of the second plurality of openings and adjacent to the dielectric;
   forming a separating dielectric to separate the sacrificial spacers within each of the second plurality of openings;
   forming a sacrificial protection layer overlying the separating dielectric;
   removing the sacrificial spacers;
   removing the sacrificial protection layer;
   forming at least two memory storage regions within each of the second plurality of openings; and
   forming a common control electrode overlying the at least two memory storage regions.

2. The method of claim 1 further comprising:
   forming a threshold voltage adjust implant region in the semiconductor substrate and between two adjacent sacrificial spacers within at least a predetermined one of the second plurality of openings.

3. The method of claim 1 further comprising:
   forming the sacrificial spacers with disposable nitride or oxide sidewall spacers.

4. The method of claim 1 further comprising: forming the at least two memory storage regions with at least one selected from a group consisting of a plurality of nanoclusters, nitride traps, oxide traps, metal or polysilicon floating gates or a combination thereof.

5. The method of claim 1 wherein the sacrificial protection layer further comprises one of nitride or polysilicon.

6. The method of claim 1 further comprising forming an array of memory devices having a plurality of the memory device as recited in claim 1.

7. The method of claim 1 wherein the separating dielectric comprises one of an oxide or a low dielectric constant material.

8. The method of claim 1 further comprising:
   thinning the sacrificial protection layer to expose a portion of the sacrificial spacers before removing the sacrificial spacers.

9. The method of claim 8 wherein the thinning of the sacrificial protection layer further comprises one of etching or polishing.

10. The method of claim 1 wherein forming the at least two memory storage regions within each of the second plurality of openings further comprise forming a substantially continuous layer of discrete storage elements overlying the separating dielectric within at least a portion of the second plurality of openings.

11. The method of claim 10 further comprising forming nanoclusters as the continuous layer of discrete storage elements.

12. A method for forming a non-volatile memory device, comprising:
   providing a semiconductor substrate;
   forming a masking layer having a plurality of openings overlying the semiconductor substrate;
   forming a first plurality of sacrificial spacers along edges of the plurality of openings;
   forming a separating dielectric to separate the first plurality of sacrificial spacers within each of the plurality of openings;
   forming a sacrificial protection layer overlying the separating dielectric;
   removing the first plurality of sacrificial spacers;
   removing the sacrificial protection layer;
   forming a layer of memory storage material;
   forming a second plurality of spacers along edges of the first plurality of openings, the second plurality of spacers overlying a portion of the layer of memory storage material to form at least two memory storage regions within each of the plurality of openings;
   removing the layer of memory storage material from areas not underlying the second plurality of spacers;
   forming a common control electrode between and overlying the at least two memory storage regions; and
   forming diffusion regions within the semiconductor substrate and adjacent the common control electrode.

13. The method of claim 12 further comprising:
   forming a threshold voltage adjust implant region in the semiconductor substrate and between two adjacent sacrificial spacers within at least a predetermined one of the plurality of openings.

14. The method of claim 12 further comprising:
   forming the first plurality of sacrificial spacers with disposable nitride or oxide sidewall spacers.

15. The method of claim 12 further comprising: forming the layer of memory storage material with at least one selected from a group consisting of a plurality of nanoclusters, nitride traps, oxide traps, metal or polysilicon floating gates or a combination thereof.

16. The method of claim 12 wherein the sacrificial protection layer further comprises one of nitride or polysilicon.

17. The method of claim 12 further comprising forming an array of memory devices having a plurality of the non-volatile memory device as recited in claim 12.

18. The method of claim 12 wherein the separating dielectric comprises one of an oxide or a low dielectric constant material.

19. The method of claim 12 further comprising:
   thinning the sacrificial protection layer to expose a portion of the first plurality of sacrificial spacers before removing the first plurality of sacrificial spacers.

20. The method of claim 19 wherein the thinning of the sacrificial protection layer further comprises one of etching or polishing.

21. A method of forming a data storage device comprising:
   providing a semiconductor substrate;
   forming a sacrificial oxide overlying the semiconductor substrate;
   forming a masking material overlying the sacrificial oxide, the masking material having a plurality of openings;
   forming diffusion regions in the semiconductor substrate in areas underlying the plurality of openings of the masking material;
   forming a dielectric adjacent the masking material and substantially filling the plurality of openings;
   removing the masking material and forming disposable sidewall spacers adjacent edges of the dielectric;
   forming a separating dielectric to separate the disposable sidewall spacers within each of the plurality of openings;

forming a sacrificial protection layer overlying the separating dielectric, the sacrificial protection being processed to leave a portion of the disposable sidewall spacers exposed;

removing the disposable sidewall spacers;

removing the sacrificial protection layer;

forming at least two memory storage regions within each of the plurality of openings; and forming a common control electrode overlying the at least two memory storage regions.

* * * * *